US007445880B2

(12) United States Patent
Anyumba et al.

(10) Patent No.: US 7,445,880 B2
(45) Date of Patent: Nov. 4, 2008

(54) LITHIUM SALT OF POLYACETYLENE AS RADIATION SENSITIVE FILAMENTS AND PREPARATION AND USE THEREOF

(75) Inventors: Janette Anyumba, Wayne, NJ (US); David F. Lewis, Monroe, CT (US); Hsiao-Yi Shih, Whippany, NJ (US); Xiang Yu, Bridgewater, NJ (US)

(73) Assignee: ISP Investments Inc., Wilmington, DE (US)

( * ) Notice: Subject to any disclaimer, the term of this patent is extended or adjusted under 35 U.S.C. 154(b) by 30 days.

(21) Appl. No.: 11/338,017

(22) Filed: Jan. 24, 2006

(65) Prior Publication Data

US 2006/0134551 A1 Jun. 22, 2006

Related U.S. Application Data

(63) Continuation-in-part of application No. 10/789,007, filed on Feb. 27, 2004, now abandoned.

(60) Provisional application No. 60/459,559, filed on Apr. 1, 2003.

(51) Int. Cl.
*G03F 7/00* (2006.01)
*G03F 7/004* (2006.01)

(52) U.S. Cl. .................................... 430/270.1; 430/311

(58) Field of Classification Search ............... 430/270.1
See application file for complete search history.

(56) References Cited

U.S. PATENT DOCUMENTS 4,921,531 A * 5/1990 Nagle et al. .................... 75/351
5,232,820 A * 8/1993 Lewis et al. .................. 430/338
5,731,112 A * 3/1998 Lewis et al. .................... 430/15
6,017,390 A * 1/2000 Charych et al. ............... 117/68
6,177,578 B1 * 1/2001 Lewis et al. .................. 554/121

* cited by examiner

*Primary Examiner*—Amanda C. Walke
(74) *Attorney, Agent, or Firm*—William J. Davis; John F. Kane

(57) ABSTRACT

This invention relates to photochromic filaments composed of the lithium salt of a conjugated, polymerizable polyacetylene having a carboxylic acid or carboxylate terminal group wherein the length to width ratio of said filaments is between about 5000:1 and about 5:1 and the average length of the filament is up to about 5 cm. The invention also pertains to the use of said salts in maximized radiation sensitivity for imaging, radiation dose measurement or mapping and detection of radiation fields.

29 Claims, No Drawings

LITHIUM SALT OF POLYACETYLENE AS RADIATION SENSITIVE FILAMENTS AND PREPARATION AND USE THEREOF

CROSS REFERENCE TO RELATED APPLICATION

This application is a continuation-in-part of application Ser. No. 10/789,007, filed Feb. 27, 2004, now abandoned which is a continuation-in-part of Provisional Application Ser. No. 60/459,559, filed Apr. 1, 2003.

FIELD OF THE INVENTION

The invention concerns a unique polyacetylene lithium salt in the form of particles having a specific dimension which salt undergoes a change of color or color density as a function of cumulative exposure to a source of radiation and to the use of said salts as a media for accurate and high resolution image recording and visual display. The invention also relates to the preparation of the lithium salt in the form of filament-like particles which exhibit superior sensitivity.

BACKGROUND OF THE INVENTION

Photochromic polyacetylenes responsive to radiation exposure have been disclosed in several U.S. Patents, namely U.S. Pat. Nos. 4,066,676; 4,581,315; 3,501,302; 3,501,297; 3,501,303; 3,501,308; 3,772,028; 3,844,791, 3,954,816, 5,232,820, 5,731,112, 6,017,390, and 6,177,578. Of these polyacetylene compounds, including those of highest sensitivity, the recording of image or dosage information has presented several problems and shortcomings including an inadequate degree of resolution, clarity, color instability of an imaged pattern. The prior polyacetylene compounds appear to be incapable of forming stable radiation dosage indicia. Other deficiencies include a relatively slow image development, and, in some cases, the impractical need to image at extremely low temperatures or at excessively high dosage levels.

While lithium salts of various polyacetylene compounds have been mentioned as possible candidates for radiation image recording, they have not provided a desired radiation sensitivity or clarity in image recording demanded for commercial success.

Accordingly, it is an object of the present invention to overcome the above difficulties and deficiencies by the use of a specific group of polyacetylene compounds in a unique form and dimension to achieve an unprecedented high radiation sensitivity which is responsive to all forms of radiation including that generated by an electron beam, gamma rays, β-rays, x-rays, ion beam, ultra-violet and visual light generated from actinic radiation in the visible and infra-red regions of the electromagnetic spectrum and other forms of corpuscular and/or wave-like energy generally deemed to be forms of radiant energy.

Another object of the invention is to maximize radiation sensitivity of a lithium/polyacetylene salt in a filamentary state.

Another object is to employ a highly sensitive radiochromic lithium salt of a polyacetylene as a coating on a substrate or as a powder or tablet.

Yet another object is to provide an economical and commercially feasible method for preparing the lithium salts of this invention.

Still another object is to provide improved method for two- or three-dimensional imaging.

These and other objects and advantages of the invention will become apparent from the following description and disclosure.

SUMMARY OF THE INVENTION

In accordance with this invention there is provided a radiation sensitive lithium salt of a $C_6$ to $C_{64}$ conjugated polymerizable polyacetylene having at least one terminal carboxylic acid or carboxylate group in the form of hair-like or bristle-like filaments and size measured in microns (μm) wherein the length to width ratio of said filaments is at least 5:1 and as high as 5000:1 or more up to several thousand to one. The lithium salt particles are discretely and uniformly dispersed in a matrix which is chemically inert to the salt or any polymerized and/or crosslinked product thereof and the salt containing matrix can be disposed on a substrate or other object receiving radiation.

It is to be noted that the present invention relates to hair-like filamentary forms and functions superior to crystalline, plate-like forms.

DETAILED DESCRIPTION OF THE INVENTION

In the present invention, the radiation sensitive lithium salt of the polyacetylene compound is derived from the reaction between a lithium compound and a polyacetylene (PA) having a conjugated structure and represented by the formula:

$$A\text{-}(CH_2)_m\text{—}(C{\equiv}C\text{—})_p\text{—}(CH_2)_n\text{—}B$$

wherein m and n each independently have a value of from 0 to 30; p has a value of 2 to 4; A is —COOH or —COOR and B is R, $—OR_1$, —OH, $—COOR_2$, —COOH, $—CONR_3R_4$ or $—(CH_2)_r—O—CO—NR_5R_6$ or a metal salt of the acid or ester; and where R, $R_1$, $R_2$, $R_3$, $R_4$, $R_5$ and $R_6$ are each independently hydrogen or $C_1$ to $C_{12}$ saturated or unsaturated aliphatic hydrocarbon group or aryl and r has a value of from 1 to 4. Also mixtures of the above polyacetylene monomers can be employed. Of these, pentacosa-10,12-diynoic acid (PCDA), tricosa-10,12-diynoic acid (TCDA), heneicosa-10,12-diynoic acid (HCDA) and eicosa-5,7-diynoic acid (ECDA) are preferred.

The lithium reactant heightens the radiation sensitivity of the polyacetylene compound and for the purposes of this disclosure is referred to as the lithium sensitizer. Suitable lithium sensitizers are those which readily undergo a substitution reaction wherein lithium replaces the hydrogen or R group in at least one of the polyacetylene terminal groups to form the corresponding salt. Accordingly, it is preferable to employ the lithium sensitizer in as close to a stoichiometric amount as it is convenient to maintain; however it will be understood that lesser or greater amounts of the sensitizer, such as 1:10-5:1 lithium to functional polyacetylene group, can be used without departing from the scope of the present invention. Suitable lithium reactants are water soluble compounds and include, but are not limited to, lithium halides; lithium nitrate; lithium sulfate; lithium carbonate; lithium alkyl carboxylates, e.g. lithium-acetate, -oxylate, -maleate, -lactate, etc.; lithium aryl carboxylates, e.g. lithium benzoate and mixtures of the foregoing lithium compounds.

Although the particle length to width ratio of 5000:1 or more provides the highest sensitivity, the viscosity of such products may be unsuitable for coating purposes. Accordingly, it is recommended that for preferred coating media, the particle length to width ratio be reduced, for example to between about 100:1 and 5:1, ideally with an average particle length of not more than 50 μm. This can be accomplished by a series of particle size reduction and Oswald ripening steps hereinafter described. For other purposes employing a powder of the lithium/polyacetylene salt filaments dispersed in a dry matrix, e.g. as in tablet formation, the higher or highest length/width ratios can be used.

To form the filaments of the invention, certain parameters in their preparation, such as forming a polyacetylene solution before contacting with the lithium sensitizer and periods of ripening the Li/PA salt, must be observed.

In one embodiment, the present invention pertaining to coatings involves the preparation of a suitable formulation to obtain a uniform coating on a substrate. The essential steps for achieving formation of the filaments comprise, in sequence, selection of an inert aqueous matrix solution; introducing and mixing the selected polyacetylene (PA) compound predissolved in an aqueous base solution at a temperature above the melting temperature of the matrix until a uniform solution is obtained; adding the selected lithium salt sensitizer to the solution under constant agitation to form the lithium salt solution of the selected PA; quenching the resulting solution, preferably by refrigeration, and holding at the quench or refrigeration temperature for a period of at least 1 hour, preferably 3 or more hours, to solidify and form nuclearation of the desired salt particles; heating the mixture to a temperature of between about 40° and about 100° C. to allow the particles to grow to an average length in excess of 50 μm over a period of at least 1 hour; preferably 3 or more hours, and reducing the particle length by milling, sonication, or other mechanical means; ripening the particles of reduced size by reheating to an elevated temperature for one or more hours and repeating the last two steps until a predetermined particle size, desirably an average particle length <50 μm and a particle length to width ratio of from 100:1 to 5:1 and high sensitivity, is obtained.

As indicated above, before the reaction with the lithium sensitizer is initiated, it is critical that the selected PA component be prepared in soluble form by dissolving it at an elevated temperature in an aqueous solution of a base, preferably an organic base, most preferably a tetra(alkyl) ammonium hydroxide, e.g. tetraethyl ammonium hydroxide. Optionally, a film-forming polymer described below can be added to the solution. The dissolved PA component is introduced into the selected matrix material and the desired amount of aqueous lithium sensitizer solution, e.g. up to about 30 wt. % aqueous solution, is only then introduced and reacted with the dissolved PA component to form the corresponding nucleated Li-PA salt before ripening to form the hair-, needle- or bristle-like particles which exhibit significantly increased radiation sensitivity over the initial PA component or any Li salt platelets produced by prior research procedures. In contrast the present filamentary particles possess a high ratio of length to width, typically at least 5:1, more often at least 10:1 and optimally at least 100:1. The sensitized salt can be conveniently prepared as a coating composition by combining the PA solution with from about 1 to about 50 wt. % of an aqueous solution of the base; from about 0.5 to about 10 wt. % of the lithium sensitizer and from about 0 to about 3 wt. % of a film forming polymer.

Suitable matrices for coating of the present salt are water or film forming polymers which may be mixed with the dissolved PA component. The polymeric matrices include, but are not limited to natural polymers such as gelatin, agar, xanthan gum and synthetic polymers or co-polymers such as polyvinylpyrrolidone, polyvinylamines, polyvinylimides, polyacrylic acid and polyacrylates, polyvinyl alcohol and vinyl ether-maleic acid co-polymers. Useful water dispersible polymers include, but are not limited to, emulsions or dispersions of poly(alkenes), polyacrylates, and polyvinylhalides. When used, weight ratios of PA/film forming polymer from about 100:1 and 1:10 can be employed, although ratios of from about 3:1 to about 1:3 are more conservatively desirable.

Completion of the reaction producing the lithium salt of the PA component is indicated by the formation of an opaque dispersion of the Li-PA salt. It is observed that the most sensitive Li-PA dispersions of this invention are those having long hair-like filaments, particularly those where the hair-like filaments are >25 μm, e.g. >100 μm long optimally >500 μm long. Hair-like filaments >100 μm long are often curly and have a ratio of length to width of at least 10:1, usually >100:1.

A disadvantage of long, curly hair-like particles is that they are subject to entanglement. Not only does this dramatically increase the viscosity of the Li-PA salt dispersion, but such agglomerated clumps cause the dispersion to lose its smoothness and become lumpy. Such high viscosity and lumpiness is not conducive to the production of smooth and uniform coatings; although the entangled particles may be employed for non-coating uses, such as dried and compressed powders or tablets which may be applied directly to a radiation receiving object.

To overcome the objection to long thread or hair-like particles and products of high viscosity, the Li-PA salt solution is additionally processed with treatments to reduce their length. Such processes include grinding, milling, sonication and the like. Application of such processes generally fluidize the Li-PA salt dispersion and make it suitable for the production of smooth coatings. It is preferable that the length of the hair-like particles be reduced to less than about 50 μm to facilitate the production of smooth coatings.

Notwithstanding the benefits of lower viscosity for improved coating properties, it is observed that the reduction in particle length is often accompanied by an undesirable reduction in radiation sensitivity. However in accordance with the present invention, the sensitivity can be restored while retaining low viscosity by ripening the product mixture for at least 1 hour at an elevated temperature between about 40° C. and 100° C., preferably between 50° C. and 70° C., over a period of 2-48 hours. Critically the particle-size reduction and ripening steps are repeated 2-10 times, more often 2-4 times, in order to optimize the radiation sensitivity of the Li-PA salt filaments and to produce smooth coatings. It is observed that after each successive ripening step the Li-PA salt filaments become shorter, straighter and more radiation sensitive, i.e. the longer hair-like particles assume a shorter bristle-like or needle-like form. An optimized radiation sensitivity and coatability is obtained after 2-4 iterations of the milling and ripening steps resulting in filament formation of between about 10 μm and 50 μm length having a length to width ratio greater than 5:1, desirably >10:1 and preferably >20:1.

The resulting radiochromic Li-PA salt filaments exhibit an unprecedentedly high sensitivity to all forms of radiation exposure and are capable of producing 2-D and 3-D images in infinitely stable, precise and clear definition as well as providing stable color gradations in response to various amounts of radiation exposure. A method of producing 3-D images is described in Provisional U.S. Patent Application Ser. No. 60/459,559, filed Apr. 1, 2003 of which the entire disclosure is incorporated herein by reference.

In yet another embodiment of the invention, the Li-PA salt particles, having a length to width ratio of at least 10:1 μm, may be dispersed in a solid matrix to form the radiation sensitive active composition which can be directly applied to a substrate. Suitable solid matrix components uniformly mixed with the Li-PA salt in a dried state include compressible wax, putty, salt, microcrystalline cellulose, polyvinylpyrrolidone, etc. The recommended ratio of matrix to Li-PA salt is between about 20:1 and about 1:20 parts per part. In the present invention, the salt filamentsis undergo polymerization, indicated by color formation, when exposed to actinic radiation. The change in color can be measured and is correlated to the dose of radiation absorbed by the active salt filaments or the active salt filament composition. Optionally, the active salt composition may be applied to a transparent or reflective substrate to form a layer capable of recording images. In yet another embodiment the active salt composition or active salt component may be applied to an article in order to provide an indicator that undergoes a visual change responsive to radiation exposure.

As indicated above the matrix of the invention can be any solid or liquid material which is chemically inert to the lithium sensitizer, the monomeric polyacetylene component and any polymer or crosslinked product thereof. Suitable examples of such matrices include polymers soluble in either aqueous and/or non-aqueous solvents. The liquid matrix, usually employed is a 1-40 wt % aqueous solution, preferably a 2-20 wt % aqueous solution, of a natural or synthetic polymer, or mixtures thereof. The active Li/PA salt monomer or oligomer to the liquid matrix is in a weight ratio of from about 100:1 to about 1:10, preferably from about 5:1 to about 1:5.

In still another embodiment of the present invention, a secondary sensitizer can be mixed with the Li-PA salt product, or used in close proximity to the present salt product in order to further enhance sensitivity to certain types or forms of radiation. For example the secondary sensitizer may be incorporated in a coating applied over the product, or it may be present in the substrate over which the product is deposited. Representative examples of such secondary sensitizers for photon radiation with from about 10 KeV to about 200 KeV energy include compounds containing at least one radiation absorbing element having an atomic number >11, e.g. compounds containing lead, iodine, cesium, barium, bromine and rubidium. The choice of such sensitizers is well recognized by those skilled in the art. For example, compounds containing boron would be useful as sensitizers for neutron radiation. Sensitizers for UV and visible radiation include those well known and employed in conventional silver halide films.

The present optically active Li-PA salt hair-, needle-, bristle- or rod-like filaments having a high ratio of length: width are found to align parallel to the direction of flow in coating dispersions on a substrate and provide optically active coatings. When the present coatings are exposed to radiation they become colored as a result of polymerization of the polyacetylene moiety. In those wavelengths of the visible-UV spectrum where the polymer absorbs light, the coatings act to polarize light, i.e. they absorb more strongly when the incident light is polarized perpendicular to the long axis of the polymer filaments and less strongly when the light is polarized parallel to the filaments. The lithium sensitized active polyacetylene monomer has several absorption bands between about 220 nm and 300 nm and exposure to UV radiation in this range of wavelengths results in the immediate polymerization. However, when the UV light is polarized in a direction parallel to the long axis of a filament particle, the particle it will not absorb the radiation and will not polymerize.

Articles or devices containing the present Li-PA salt filaments are suitable for radiation imaging, radiation detection, radiation measurement or radiation indication include:

- coatings of the present product or product compositions onto transparent, reflective, translucent or opaque substrates;
- powders, or tablets made from compressed powders, or mixtures of powders and binders;
- slurries, emulsions, or dispersions of the present salt product in liquid media, including those where the liquid is a pure compound, a mixture of liquid compounds, or a solution of at least one solute in at least one solvent, or where liquid compounds are emulsified;
- coatings of the present product or product composition on optical transmission elements such as optical fibers, rods or plates;
- articles where the product or product composition is coated on or otherwise incorporated into a transducer device—specific examples include, but are not limited to, devices, including integrated electronic devices, containing light emitting and or light sensing elements; devices, including integrated electronic devices, containing piezoelectric or stress sensing elements; devices, including integrated electronic devices, that function through measuring a change in the electrical properties of the product or product composition;
- articles in which the present filaments are spun or otherwise formed into threads, wires or fibers;
- articles wherein the threads, wires or fibers composed of present filaments are woven together;
- optical computing;
- batteries, e.g., lithium ion batteries; and
- articles in which the filaments or filamentary compositions are formed into a mat, or paper.

Examples of preferred embodiments for the preparation of the present Li-PA salt filaments of this invention are described in the following examples.

EXAMPLE 1

Preparation and Sensitivity of Hair-Like Particles

Part A is prepared by dissolving a bone gelatin in water to provide a 10% solution.

Part B is prepared by mixing 5 g of pentacosa-10,12-diynoic acid (PCDA) and an equimolar amount of a 20% aqueous solution of tetraethyl ammonium hydroxide together with water to bring the total weight to 100 g. The mixture is heated to about 70° C. and stirred to dissolve the PCDA. The resulting solution of tetraethyl ammonium pentacosa-10,12-diynoate is filtered and collected.

Part C a 10% solution of lithium acetate in water is separately prepared. A radiation sensitive composition is formed by mixing (at about 50° C.) 10 g of Part A with 10 g of Part B and then adding and mixing Part C in an amount providing about 0.3 moles of Li for every mole of PCDA.

The mixture is cooled to refrigerator temperature (about 2°-8° C.) whereupon it gradually becomes milky white as particles of lithium pentacosa-10,12-diynoate form. At this stage, the composition becomes photoactive as evidenced by the appearance of a blue coloration immediately upon exposure to a short wavelength UV lamp.

After a few hours, a portion of the sample is heated to about 50° C. whereupon it melts to a viscous liquid. When a sample of this liquid is examined under 500× magnification in an optical microscope it is difficult to clearly distinguish individual particles since they are too small be resolved under visible light. When the mixture is held for a few hours at 50°-60° C., it gradually becomes more viscous and observation in the microscope at 500× reveals the formation of a dispersion composed of hair-like filaments in the aqueous gelatin matrix. These filaments are curly and have a width of about 0.5 μm and a length of tens to hundreds of micrometers. Observation in the microscope also shows that the hairs align, or partially align with liquid flow patterns in the microscope slide and that individual hairs appear to aggregate into larger and longer filament units. These aggregates form in the flow around obstacles to the fluid flow such as dirt or dust particles.

At this stage the dispersion of filaments is exceptionally photosensitive as judged by the response to UV exposure, or the exposure to x-rays (120 kVp, 2 mm Al filtration). When exposed to a dose of a <10 cGy of the aforementioned x-rays, the composition turns a deep blue color. However, attempts to provide smooth, uniform coatings of the composition are not successful because of the very high viscosity and "lumpiness" of the composition, which based on microscope observation, is attributed to the entanglement of the long hair-like particles in the sample.

EXAMPLE 2

Reducing the Length of Hair-Like Filaments

A sample of the dispersion of Example 1 is prepared for microscopy by placing a drop of the dispersion on a microscope slide and covering it with a cover slip. It is observed that by pressing on and rotating the cover slip the viscosity of the dispersion is significantly reduced and when the slide is subsequently observed in the microscope it is evident that the length of the hairs is dramatically shortened.

A 20 g sample of the dispersion of Example 1 is melted at 40° C. and very briefly subjected to sonication. The dispersion immediately becomes fluid and using a wire wound rod it can be coated uniformly on a polyester substrate to form a smooth film. Observation of the sonicated dispersion by microscopy shows that the length of the hair-like particles has been reduced from hundreds of micrometers to less than 20 micrometers. However, when samples of the filament dispersion before and after sonication are exposed to x-rays it is found that the sonicated dispersion is much less sensitive than it was prior to sonication. The sensitivity is reduced by a factor of 4, or more.

EXAMPLE 3

Ripening the Filament Dispersion

The sonicated filament dispersion is heated to about 60° C. and maintained at this temperature for several hours. During this time the viscosity and photosensitivity increase. The sensitivity of this dispersion is one-half of that of the pre-sonicated dispersion of Example 1. The viscosity of the dispersion, while less than that of pre-sonicated dispersion, is still too high to permit the preparation of smooth and uniform coatings.

Observation of the dispersion at 500× magnification with an optical microscope reveals that the hair-like filamentary particles are now about 20 μm-100 μm long. The particle width is greater than originally formed, but still <1 μm.

EXAMPLE 4

Further Size Reduction and Ripening

The treatments of Examples 2 and 3 are repeated on a sample of filament dispersion as described in Examples 1-3 was prepared according to Example 1 and the sonicated and ripened as described in Examples 2 and 3. After a first iteration of both processes the viscosity of the dispersion was further decreased and the sensitivity was about ⅔ of that of the dispersion of Example 1. The viscosity was reduced so that smooth, uniform coatings were achieved. The length of the filament particles was about 20 μm-50 μm and their width was about 1 μm.

Upon further iterations of the sonication and ripening processes of Examples 2 and 3, the sensitivity of the resulting product closely approaches the sensitivity of the original dispersion prior to sonication or ripening processes. The present dispersion remains fluid and provides smooth and uniform coatings. After repeated processing, the size of the filamentary particles is reduced to a length of about 20 μm-30 μm and a width of about 1 μm-2 μm while still retaining high radiation sensitivity.

EXAMPLE 5

Sensitivity of Film to Megavoltage Radiation

A dispersion sample was prepared as in Example 4 in which the dispersion was three times sonicated and three times ripened. This dispersion was coated from a cascade applicator onto a transparent polyester substrate and dried to form a layer with a thickness of about 15 μm. When this coating was exposed to a dose of 2Gy of x-radiation from a megavoltage linear accelerator the coating developed a blue coloration. The net change in visual density of the sample due to the radiation exposure was about 0.3. When the densitometer was furnished with a narrow passband filter (10 nm FWHM centered at about 636 nm) the net density was approximately 0.6. When the visual absorption spectrum of the film was measured on a spectrophotometer a minor peak was observed at about 580 nm and a major peak at about 635 nm. The maximum net change in density due to exposure was about 0.65 at the 635 nm wavelength. These results show that the best results are obtained by measuring within a narrow band of wavelength close to 635 nm.

EXAMPLE 6

Effect of a Polarizer Sheet

A film sample prepared as in Example 5 was exposed to a 2Gy dose of megavoltage radiation. The film was placed parallel to a polarizer sheet and when the polarizer was rotated about an axis perpendicular to the plane of the polarizer sheet and the film, it was observed that the darkness of the film changed. The polarizer sheet and a piece of unexposed film were placed on a densitometer and the visual density was zeroed. When the piece of unexposed film was rotated at numerous angles and re-measured, it was observed that the visual density was substantially independent of the angle of rotation. However when the unexposed film was replaced with the film exposed to 2Gy, the visual density was found to vary from a low value of 0.29 to a high value of 0.35 as the sample was rotated through 360°. The density was maximum when the direction of coating of the film sample was orthogonal to the axis of polarization of the polarizer sheet. When these measurements were repeated with the addition of a 636 nm passband filter (10 nm FWHM), the density changed with the angle of rotation from a minimum of about 0.55 to a maximum of about 0.8.

EXAMPLE 7

Effect of Orientation of Film

Two film samples prepared as in Example 5 were exposed to a 2Gy dose of megavoltage radiation. The films were placed parallel to one another and when one film was rotated about an axis perpendicular to the plane of the films, it was observed that the darkness of the film pair changed with the angle of rotation. Two unexposed films were placed on a densitometer and the densitometer was zeroed in visual density space. When the unexposed films were rotated relative to one another it was observed that the visual density was substantially independent of the angle of rotation. However when the unexposed films were replaced with the films exposed to 2Gy, the visual density varied with the angle of rotation from about 0.55 to about 0.75. The density was maximum when the films were oriented with their direction of coating orthogonal to one another. The density was minimum when the directions of coating were co-linear. When these measurements were repeated with the addition of a 636 nm passband filter (10 nm FWHM), the density changed with the angle of rotation from a minimum of about 1.15 to a maximum of about 1.55.

EXAMPLE 8

Effect of Lamination of Film

Four film samples prepared as in Example 5. Two films were placed face-to-face in a parallel orientation aligned along the direction of coating. A small amount of water was placed between the sheets and they were laminated by passing them quickly through the nip between two rollers. Excess water was squeezed out and the films became laminated to one another. A similar laminate was prepared except that the films were in a crossed orientation with their directions of coating orthogonal to one another.

The two laminates were exposed to a 2Gy dose of megavoltage radiation and their densities measured. The visual density of the laminate with parallel orientation was lower than the visual density of the crossed laminate. When the crossed laminate was observed through a polarizer sheet it was found that the density was independent of the angle of rotation. However, when the parallel laminate and polarizer sheet were combined the density was dependent on the angle of rotation. The density was maximum when the axis of polarization of the polarizer sheet was orthogonal to the coating direction of the film laminate and mimimum when the coating direction and axis of polarization were aligned. The density of the crossed laminate was intermediate between the minimum and maximum of the parallel laminate-polarizer sheet combination.

Similar observations were made when the densities were measured through a 636 nm passband filter (10 nm FWHM) except that the densities with the passband filter were always greater than the corresponding visual densities.

EXAMPLE 9

Effect of Millinq on Particle Length and Sensitivity

A 20 g sample of the dispersion of Example 1 was melted at 40° C. and passed through a colloid mill with a gap of about 5 μm. The dispersion becomes fluid and using a wire wound rod it can be coated uniformly on a polyester substrate to form a smooth film. Observation of the milled dispersion by microscopy showed that the length of the hair-like particles had been reduced from hundreds of micrometers to about 20 μm-50 μm. However, when samples of the dispersion before and after milling were exposed to x-rays it was observed that the milled dispersion was much less sensitive than it was prior to milling. The sensitivity was reduced by at least a factor of 4.

The milled dispersion may be ripened as in Example 3. Ripening increases the length of particles and sensitivity of milled dispersion in a similar fashion to the ripening of sonicated dispersion.

EXAMPLE 10

Further Milling and Ripening

A sample of dispersion was prepared according to Example 1 and the milled and ripened as described in Example 9. The process was iterated. After one iteration the viscosity of the dispersion was further decreased and the sensitivity was about ⅔ of that of the dispersion of Example 1. The viscosity was low enough that it was possible to make smooth, uniform coatings. The length of the particles after the second iteration is about 20 μm-50 μm with a width of about 1 μm.

Upon further iterations of the milling and ripening process the sensitivity becomes closer and closer to the sensitivity of the original dispersion prior to any milling. The dispersion remains fluid and can be used to furnish smooth and uniform coatings. After repeated processing the size of the particles asymptotes to a length of about 20 μm-30 μm and a width of about 1 μm-2 μm.

EXAMPLE 11

Preparation of Hair-Like Particles in Surfactant Solution

Part A is prepared by mixing 5 g of pentacosa-10,12-diynoic acid (PCDA) and an equimolar amount of a 20% aqueous solution of tetraethyl ammonium hydroxide together with water to bring the total weight to 100 g. The mixture is heated to about 70° C. and stirred to dissolve the PCDA. An amphoteric surfactant, Amphosol C A, is added to make a 2% concentration. The resulting solution of tetraethyl ammonium pentacosa-10,12-diynoate is filtered.

Part B is a 10% solution of lithium acetate in water.

A composition is prepared by mixing (at about 50° C.) 10 g of Part A with 10 g of water and further adding and mixing Part B in an amount providing about 0.9 moles of Li for every mole of PCDA.

The mixture is cooled to room temperature (about 22° C.) whereupon it gradually becomes milky white as particles of lithium pentacosa-10,12-diynoate form. At this stage, the composition is photoactive as evidenced by the appearance of a blue coloration immediately upon exposure to a short wavelength UV lamp. The mixture becomes more photoactive with time until it attains its maximum photoactivity.

After a few minutes, a portion of the sample is examined in an optical microscope. Very fine hair-like particles can be seen. It is estimated that they are about 10 μm-20 μm long and <0.5 μm wide. When the mixture is held overnight at room temperature a putty-like mass separates from the liquid. Observation of a sample of this material in the microscope at 500× reveals that it is composed of a mass of intertwined hair-like particles. These particles are observed to be about 1 μm in width and up to at least several hundred micrometers in length. Individual hairs are curly, not straight, and are exceptionally sensitive to UV and X-ray radiation. When exposed to a dose of only 1 cGy of the aforementioned x-rays, the composition turns a blue color.

EXAMPLE 12

Preparation of Film and Sensitivity to Kilovolt Age Radiation

A dispersion was prepared as in Example 5 and coated on an opaque white film base to form a dry layer about 15 μm thick. To this film a surface layer composed of aqueous gelatin and a secondary sensitizer, cesium bromide was coated over the active layer. After drying, the gelatin/cesium bromide layer contained about 25 weight % cesium bromide and was about 8 μm thick. This coating was exposed to a dose of 1 cGy of x-radiation (120 kVp, 2 mm Al filtration) and the coating developed a blue coloration. The net change in the visual reflection density of the sample due to the radiation exposure was 0.14. The density change was 0.2 when measured in the red color channel of the densitometer.

The experiment was repeated except that the cesium bromide was omitted. When the resulting film was exposed to a 0.9 cGy dose of x-rays (120 kVp, 2 mm Al), there was no visible change and no change in density.

EXAMPLE 13

Preparation of Laminate and Sensitivity to Kilovoltage Radiation

A dispersion was prepared as in Example 5 and coated on an opaque white film base to form a dry layer about 15 μm thick. A 10% gelatin solution was prepared and 0.6 g of a secondary sensitizer, cesium bromide, was dissolved in 10 g of the gelatin solution. The resulting composition was coated onto transparent polyester using a #46 wire-wound rod. The coating was dried. The films coated with dispersion and with gel/CsBr were put face-to-face. A small amount of water was placed between the sheets and the sheets laminated by passing them quickly through the nip between two rollers. Excess water was squeezed out and the films became laminated to one another. This laminate was exposed to a 1 cGy dose of x-radiation (120 kVp, 2 mm Al filtration) and the laminate developed a blue coloration. The net change in the visual reflection density of the sample due to the radiation exposure was 0.10. The density change was 0.15 when measured in the red color channel of the densitometer.

The experiment was repeated except that the cesium bromide was omitted from the gelatin solution. When the resulting laminate was exposed to a 0.9 cGy dose of x-rays (120 kVp, 2 mm Al), there was no visible change and no change in density.

EXAMPLE 14

Observations on the Mechano-Physical Behavior of Irradiated Film

A coating was prepared as in Example 5. The coated side of the film was exposed to a shortwave UV lamp and immediately turned blue. It was observed that the film immediately developed a concave curvature indicating that the coated layer shrinks as a result of the exposure. A similar observation was made when the film was exposed to x-radiation. Furthermore, it was observed that the curvature developed around an axis normal to the direction of coating. It is believed that the shrinkage is a result of the contraction of the polyacetylene monomer as is undergoes polymerization.

EXAMPLE 15

Detector Comprised of a Polyacetylene Monomer Coated on a Piezoelectric Element

A dispersion of polyacetylene monomer was prepared as detailed in Example 1. The dispersion was applied to the surface of a piezoelectric material and dried. The piezoelectric element was incorporated in a detection circuit. When the piezoelectric element and coating were exposed to a radiation source the detection circuit registered a change in potential consistent with the development of a stress on the piezoelectric element. When the experiment was repeated without the coating of polyacetylene monomer dispersion, there was no detectable change in the state of the piezoelectric element.

EXAMPLE 16

Radiation Indicator

A radiation sensitive composition was prepared as in Example 11. A small portion of the solid material that separated from the liquid was compressed into a thin wafer and the wafer glued onto a white substrate. The words "Blue, when exposed to radiation" were printed on the substrate. When the article was exposed to 10 mGy of x-radiation the color of the wafer immediately became pale blue indicating exposure to radiation.

EXAMPLE 17

Radiation Indicator

A radiation sensitive film was prepared as in Example 5. The words "NOT IRRADIATED" were printed on a white substrate. An irradiation indicator was prepared by laminating a piece of the radiation sensitive coating over the word "NOT" using a transparent adhesive. Prior to irradiation the indicator read "NOT IRRADIATED". The indicator was exposed to a dose of 10 Gy of megavoltage radiation whereupon the radiation sensitive film turned dark blue and opaque, rendering the word "NOT" invisible. The message on the indicator read "IRRADIATED", correctly identifying its status.

EXAMPLE 18

Effects of Exposure with Polarized UV Light

A fluid dispersion is prepared similar to that used to prepare coatings of Example 5. This fluid is used to prepare a two layer coating on a substrate. Layer 1 contains particles of the polyacetylene monomer with the long axes of the particles aligned preferentially in one direction. In Layer 2 the particles are preferentially aligned orthogonal to the preferential alignment in Layer 1.

A first UV light source is polarized normal to Layer 1 and is used to expose the film. With this polarization the UV source will preferentially expose the particles in Layer 1. A second UV light source polarized normal to Layer 2 is used to expose the film and it will preferentially expose Layer 2. Information recorded in the layers can be viewed using polarized light, preferably light of a wavelength close to the absorption maximum of the polyacetylene polymer. If the light is polarized normal to the particle orientation in Layer 1 then the information recorded in Layer 1 will be revealed. Conversely if the light is polarized normal to the particle orientation in Layer 2 then the information recorded in Layer 2 will be revealed.

EXAMPLE 19

Part 1

A solution of the tetraethyl ammonium salt of pentacosa-10,12-diynoic acid was prepared by dissolving 14.9 g of said acid in 29.4 g of tetraethyl ammonium hydroxide and 105.24 g of water at 75° C. under agitation. The resulting mixture was labeled solution A.

Four grams of solution A was diluted with 4 g of water and cooled to ice temperature, after which 0.83 g of a 5% aqueous solution of lithium chloride was added under vigorous agitation. The resulting mixture, labeled Mixture B, was held at ice temperature for 16 hours and then inspected under a microscope. The chilled dispersion revealed filamentary particles of about 40-100 μm length and less than 1 μm width.

Two grams of an aqueous 20% solution of gelatin was then added to Mixture B and briefly subjected to sonication after which it was heated and held at 45° C. for 36 hours. The resulting dispersion was composed of plate-like particles of 2-20 μm by 5-50 μm.

Part 2

A 4 g portion of solution A was heated to 75° C. and then diluted with 0.4 g of water and 2 g of a 20% aqueous solution of gelatin, where after 2.2 g of a 5% aqueous solution of lithium acetate was added under vigorous agitation. As above, the resulting mixture was quenched in ice and held at 0° C. for 16 hours. Microscopic observation of the resulting dispersion revealed plate-like particles of about 1-2 μm size.

Part 3

A 2 g portion of solution A was diluted with 1 g of water and mixed with 1 g of a 20% aqueous solution of gelatin and then 0.6 g of a 5% aqueous solution of lithium acetate was added under vigorous agitation to form a solution containing the lithium salt. The resulting mixture was then quenched in ice and held at 0° C. for 64 hours to precipitate the Li/PA salt filaments. Microscope inspection showed filamentary particles predominantly having a length greater than 100 μm and a width of less than 1 μm.

The solution of filamentary particles obtained in Part 3 (0.4 g) was added to 5 g of the dispersion obtained in Part 1 and the resulting mixture heated at 45° C. for 24 hours. Microscopic inspection showed that the plate-like particles in the product of Part 1 had disappeared and the dispersion was composed solely of hair-like filamentary articles of greater than 200 μm length. Small samples of this dispersion mixture were applied to filter paper and exposed to radiation from a shortwave UV lamp, whereupon the samples immediately turned a distinct blue color resulting from photopolymerization. When the dispersions of Parts 2 and 3 were combined and heated in similar manner the color intensity resulting from photopolymerization was a very dark blue. However, mixtures of Part 1 and Part 2 dispersions similarly heated provided only a faint blue color resulting from the UV exposure. Only when the Part 1 and Part 2 dispersion mixture was exposed to about a 10 Gy dose of radiation did it attain a color intensity approaching that of the Part 1 and 3 dispersion mixture response to only 2 Gy.

These results indicate that the hair-like particles of lithium pentacosa-10,12-diynoate exhibit a significantly greater sensitivity than the plate-like particles of the same compound. The results also establish that the low-sensitivity of the plate-like particles (Part 1 dispersion) can be converted to high sensitivity by ripening in the presence of filamentary particles which form nuclear seeds to transform the platelets to thread-like form.

In the following examples, the components employed are defined as

Component Composition

- A 10% aqueous gelatin solution
- B 10 g pentacosa-10,12-diynoic acid (PCDA) dissolved in an equimolar amount of 20% aqueous tetraethyl ammonium hydroxide and diluted with water to 100 ml volume
- C 10% aqueous solution of lithium chloride
- D solution of 10 wt. % gelatin; 1.5 wt. % LiCl and 0.2 wt. % propyl gallate

EXAMPLE 20

Component A was mixed with 100 g of B and the resulting solution was chilled to 35° C. before the addition of 11.23 g of C (an equivalent of 0.8 moles of Li to 1 mole of said acid) under constant agitation. The resulting mixture was quick chilled and solidified in an ice water bath and then stored under refrigeration for 25 hours. The solution became progressively opaque as random solids of hair-like particles precipitated. The opaque solution was then heated to 40° C. and sonicated at an energy of 400 w. for 2 minutes followed by treatment in a 60° C. water bath overnight. The viscosity of the dispersion increased from about 50 to about 5000 cps. Microscopic inspection showed that the hair-like particles in the dispersion grew from a length of 30 μm to 1000 μm. This dispersion exhibited an extremely high radiation sensitivity.

The above viscous dispersion was then sonicated at the above energy for 5 minutes to reduce the viscosity to 10 cps and a filament length of about 20 μm. However, the sensitivity was reduced about 80% due to the particle size reduction. To remedy this, the dispersion was then ripened again in a 60° C. water bath overnight whereupon the viscosity increased to 100 cps and a filament length increased to 100 μm. A marked increase in radiation sensitivity was noted. The sonication step and ripening (2 hours) were again repeated to reduce the viscosity to less than 10 cps and achieve an average filament length of about 30 μm.

EXAMPLE 21

The dispersion product of Example 20 of viscosity 10 cps was coated on a polyester film in a thickness of 15 μm using a # 55 wire-wound bar. The film was then overcoated with D using a #5 bar in a thickness of 3 μm. The additional lithium ions supplied by the overcoating raised the molar ratio of Li to pentacosa-10,12-diynoic acid to >1.2:1. The resulting film was exposed with 120 kvp x-ray and a blue color immediately developed. The visual density difference resulting from 10 Gy exposure was about 0.5 when measured with an X-rite model 310T densitometer. In comparison, a film of similar coating thickness with the pentacosa-10,12-diynoic acid dispersion exposed at the same radiation level has a net density of less than 0.1.

EXAMPLE 22

5 grams of PCDA were dissolved in an equimolar amount of 20% aqueous solution of tetraethyl ammonium hydroxide together with water to bring the total volume to 100 ml. The solution was chilled in ice water bath to below 4° C. and 3.4 grams of 5% LiCl (an equivalent of 0.3 mole of Li to 1 mole of PCDA) was slowly added. The resulting solution was quick chilled in ice water bath. The solution gradually became opaque and viscous. The resulting solution was stored under refrigeration for 25 hours. The product showed good sensitivity to radiation. Hair-like crystals of approximately 40 μm length and diameter of sub-micron were observed under microscope.

EXAMPLE 23

In the following example, Part A is a 10% gelatin solution.

Part B is prepared by dissolving 10 grams of PCDA in an equimolar amount of 20% aqueous solution of tetraethyl ammonium hydroxide together with water to bring the total volume to 100 ml.

Part C is dispersion prepared according to Example 20.

Part D is 10% LiCl solution in water.

100 grams of Part A were mixed with 100 grams of Part B to form a solution. The solution was chilled to 40° C. and 10 grams of Part C was added. After the dispersion was well mixed, 11.23 grams of Part D (an equivalent of 0.8 mole of Li to 1 mole of PCDA) was slowly added. The resulting solution was kept at 40° C. for one hour before temperature was raised to 60° C.

The dispersion was then processed with sonication and ripening as described in Example 20. Sensitivity and structure of filamentary thread-like crystals were found to be similar to those obtained in Example 20. The dispersion was then coated as described in Example 21 to provide a smooth radiation sensitive coating.

It will be understood that modifications and substitutions consistent with the foregoing disclosure can be made in the above examples without departing from the scope of this invention. For example, any of the foregoing lithium salt sensitizers and/or polyacetylene monomers can be substituted in the above examples to provide the corresponding micron sized filamentary lithium salts having similarly enhanced radiation sensitivity. Also, the particle size and ratio of the sensitized product can be altered in the examples to obtain Li/PA salt filaments of enhanced sensitivity consistent with the use of a particular application, e.g. a liquid coating or paste, a dry powder, a compressed tablet, and the like. Also the filamentary salt product of the invention can be additionally processed by mixing a solution of it with a solution of a polymerizable, conjugated polyacetylene having at least one terminal carboxylic acid or carboxylate group or a mixture of said polyacetylenes and a lithium salt sensitizer disclosed herein to provide additional filamentary material in the form of more and/or larger filamentary particles.

What is claimed is:

1. Filamentary particles of a lithium salt of a conjugated polymerizable polyacetylene having at least one terminal carboxylic acid or carboxylate group and a mixture of said polyacetylenes; said filamentary particles having a length to width ratio of at least 5:1; said filamentary particles having no platelet particles mixed therewith.

2. The lithium salt filaments of claim 1 wherein the average length of said filaments between about 5 and about 50,000 μm.

3. The lithium salt filaments of claim 1 wherein the length to width ratio is between about 5:1 and about 5,000:1.

4. The lithium salt filaments of claim 1 wherein said salt contains from 6 to 64 carbon atoms.

5. The lithium salt filaments of claim 4 wherein said salt contains from 10 to 40 carbon atoms.

6. The lithium salt filaments of claim 5 wherein said salt is the lithium salt of a polyacetylene selected from the group consisting of pentacosa-10,12-diynoic acid; tricosa-10,12-diynoic acid; heneicosa-10,12-diynoic acid, eicosa-5,7-diynoic acid and their corresponding lower alkyl esters.

7. A photosensitive coating composition suitable for image development by exposure to a source of radiation which comprises an inert matrix containing an effective imageable amount of the lithium salt filaments of claim 1 wherein the filamentary particles have a length to width ratio of greater than 5:1 and the average length of the filaments is between about 10 and about 50 μm.

8. The composition of claim 7 wherein said matrix is water or a solution or dispersion of a natural or synthetic polymer or a mixture thereof.

9. The composition of claim 8 wherein the matrix is an aqueous solution of gelatin.

10. The composition of claim 7 wherein said salt is the lithium salt of a polyacetylene selected from the group consisting of pentacosa-10,12-diynoic acid; tricosa-10,12-diynoic acid; heneicosa-10,12-diynoic acid; eicosa-5,7-diynoic acid and their corresponding lower alkyl esters and mixtures thereof.

11. The lithium salt of claim 6 wherein said salt is the lithium salt of pentacosa-10,12-diynoic acid.

12. The composition of claim 10 wherein said salt is the lithium salt of pentacosa-10,12-diynoic acid.

13. A substrate carrying the composition of claim 7.

14. A substrate carrying the dry composition of claim 7.

15. A dosimeter comprising a substrate of claim 14.

16. A radiation indicator comprising a substrate of claim 14.

17. The process for preparing the lithium salt filaments of claim 1 which comprises the following steps in sequence:

(a) mixing a solution of a conjugated, polymerizable polyacetylene having at least one terminal carboxylic acid or carboxylate functional group in a matrix which is inert to said polyacetylene and any polymerized product thereof;

(b) contacting the carboxylic acid and/or carboxylate terminal group of the polyacetylene with a lithium salt sensitizer reactive with said carboxylic acid and/or carboxylate group to form a solution of the lithium salt of said polyacetylene;

(c) quenching the resulting matrix/lithium salt solution of (b) to below room temperature and holding at that temperature for a period sufficient to nucleate and precipitate the lithium/polyacetylene salt in the matrix;

(d) heating and holding the product of step (c) until the filaments of the lithium/polyacetylene salt form and grow to an average length greater than 5 μm and a length to width ratio of at least 5:1;

(e) reducing the length of the filaments by mechanical means;

(f) repeating steps (d) through (e) until a desired filament length and radiation sensitivity is obtained and (g) recovering the filamentary salt product of claim 1 as the product of the process.

18. The process of claim 17 wherein the lithium salt sensitizer is selected from the group consisting of a lithium halide, lithium nitrate; lithium sulfate; lithium carbonate; a lithium alkyl carboxylate; a lithium aryl carboxylate and a mixture thereof.

19. The process of claim 17 wherein step (d) is carried out at a temperature of between about 40° and about 100° C.

20. The process of claim 17 wherein said matrix is selected from the group consisting of gelatin, collagen, agar, xanthan gum, synthetic polymer and mixtures thereof.

21. The process of claim 17 wherein said matrix is an aqueous solution of gelatin.

22. The process of claim 17 wherein said matrix is water.

23. The process of claim 17 wherein the weight ratio of lithium/polyacetylene salt to matrix in step (b) is between about 100:1 and 1:10.

24. The filamentary salt of claim 1 dispersed in an inert matrix suitable for coating a substrate wherein the weight ratio of said salt to matrix is between about 4:1 and about 1:5.

25. The filamentary salt of claim 24 dispersed in a film-forming matrix selected from the group consisting of gelatin, collagen, agar, xanthan gum, a synthetic film forming polymer and a mixture thereof.

26. The filamentary salt of claim 1 dispersed in dry gelatin.

27. The process which comprises contacting a dispersion of platelets of a lithium salt of a conjugated polyacetylene with at least 0.1 wt. % of the filaments of claim 1 for a period sufficient to convert said platelets to filaments.

28. The process wherein the filamentary salt product of the process of claim 17 is contacted with a lithium/acetylene salt composed of plate-like particles and held at an elevated temperature for a period sufficient to convert the plate-like particles to filamentary particles.

29. The process wherein the filamentary salt product of claim 17 is mixed with a solution of a polymerizable, conjugated polyacetylene having at least one terminal carboxylic acid or carboxylate group or a mixture thereof and contacted with a solution of a lithium salt sensitizer selected from the group consisting of a lithium halide, lithium nitrate, lithium sulfate, lithium carbonate, a lithium alkyl carboxylate, a lithium aryl carboxylate and mixtures thereof.

* * * * *